United States Patent
Shiraishi et al.

(10) Patent No.: US 8,611,389 B2
(45) Date of Patent: Dec. 17, 2013

(54) LIGHT EMITTING DEVICE AND PACKAGE COMPONENT

(75) Inventors: Akinori Shiraishi, Nagano (JP); Mitsutoshi Higashi, Nagano (JP)

(73) Assignee: Shinko Electric Industries Co., Ltd., Nagano-shi (JP)

( * ) Notice: Subject to any disclaimer, the term of this patent is extended or adjusted under 35 U.S.C. 154(b) by 160 days.

(21) Appl. No.: 13/286,392

(22) Filed: Nov. 1, 2011

(65) Prior Publication Data
US 2012/0128021 A1 May 24, 2012

(30) Foreign Application Priority Data
Nov. 19, 2010 (JP) .................. 2010-258619

(51) Int. Cl.
*H01S 5/00* (2006.01)
(52) U.S. Cl.
USPC .............. 372/50.23; 372/34; 372/36; 372/81; 372/87; 372/101
(58) Field of Classification Search
USPC .............. 372/34, 36, 50.23, 81, 87, 101
See application file for complete search history.

(56) References Cited

U.S. PATENT DOCUMENTS

| | | | |
|---|---|---|---|
| 2007/0158674 A1* | 7/2007 | Taguchi et al. | 257/99 |
| 2008/0291955 A1* | 11/2008 | Schulte et al. | 372/36 |
| 2009/0016398 A1 | 1/2009 | Lorenzen | |

FOREIGN PATENT DOCUMENTS

JP 2009-524223 A1 6/2009

* cited by examiner

*Primary Examiner* — Yuanda Zhang
(74) *Attorney, Agent, or Firm* — Kratz, Quintos & Hanson, LLP (57) ABSTRACT

A light emitting device includes a light emitting element mounting component, including a cubic package component formed of a silicon member covered with a insulating layer, and the package component including a bottom portion, a sidewall portion provided to stand upright on both ends of the bottom portion respectively, and a backwall portion provided to stand upright on an innermost part of the bottom portion, and the package component in which a cavity is provided in an inner side, and a light emitting element mounted on an inner side surface of the backwall portion of the package component, and including a light emitting surface on an upper end part, wherein a plurality of said light emitting element mounting components are stacked in a depth direction of the cavity to direct toward an identical direction.

8 Claims, 7 Drawing Sheets

FIG. 1 electric current

(fragmental enlarged sectional view)

FIG. 10

(fragmental enlarged sectional view)

LIGHT EMITTING DEVICE AND PACKAGE COMPONENT

CROSS-REFERENCE TO RELATED APPLICATIONS

This application is based upon and claims the benefit of priority of the prior Japanese Patent Application No. 2010-258619, filed on Nov. 19, 2010, the entire contents of which are incorporated herein by reference.

FIELD

It is related to a light emitting device and a package component used for mounting the light emitting element.

BACKGROUND

Recently, the progress in the semiconductor laser technology is remarkable. Such semiconductor laser technology is applied to various electronics equipments used in the recording/playing of the optical disc, or the information communication using the optical fiber, and the like. In recent years, the stacked type semiconductor laser device capable of obtaining the high-power laser by arranging a plurality of semiconductor laser elements to stack them in the horizontal direction has been developed.

In the stacked type semiconductor laser device, the semiconductor laser elements each of which is sandwiched between the copper tungsten members are stacked in the horizontal direction, and the light converging lens is arranged on the semiconductor laser elements respectively.

A related art is disclosed in Japanese National Publication of International Patent Application No. 2009-524223.

The copper tungsten member cannot obtain a sufficient thickness precision and a sufficient surface precision (surface roughness). Therefore, it is difficult to stack a plurality of semiconductor laser elements at a narrow pitch with good precision. For this reason, particularly when an arrangement pitch between the semiconductor laser elements is made narrow, misalignment is easily caused at the time of arrangement of the lens on each semiconductor laser element. As a result, it becomes difficult to construct the stacked type semiconductor laser device with high precision.

SUMMARY

According to one aspect discussed herein, there is provided a light emitting device, which includes a light emitting element mounting component including, a cubic package component formed of a silicon member covered with a insulating layer, and the package component including a bottom portion, a sidewall portion provided to stand upright on both ends of the bottom portion respectively, and a backwall portion provided to stand upright on an innermost part of the bottom portion, and the package component in which a cavity is provided in an inner side, and a light emitting element mounted on an inner side surface of the backwall portion of the package component, and including a light emitting surface on an upper end part, wherein a plurality of said light emitting element mounting components are stacked in a depth direction of the cavity to direct toward an identical direction.

According to another aspect discussed herein, there is provided a package component, which includes a bottom portion, a sidewall portion provided to stand upright on both ends of the bottom portion respectively, and a backwall portion provided to stand upright on an innermost part of the bottom portion, a first conductive joining material provided to an inner side surface of the backwall portion and used for joining a light emitting element, and a second conductive joining material provided to an outer side surface of the backwall portion, wherein the cubic package component is formed of a silicon member covered with a insulating layer, and a cavity is provided in an inner side of the package component.

DESCRIPTION OF EMBODIMENT

An embodiment of the present invention will be explained with reference to the accompanying drawings hereinafter.

Prior to the explanation of an embodiment, the related art (preliminary matter) to be set forth as a basis will be explained hereunder.

Figure 1:
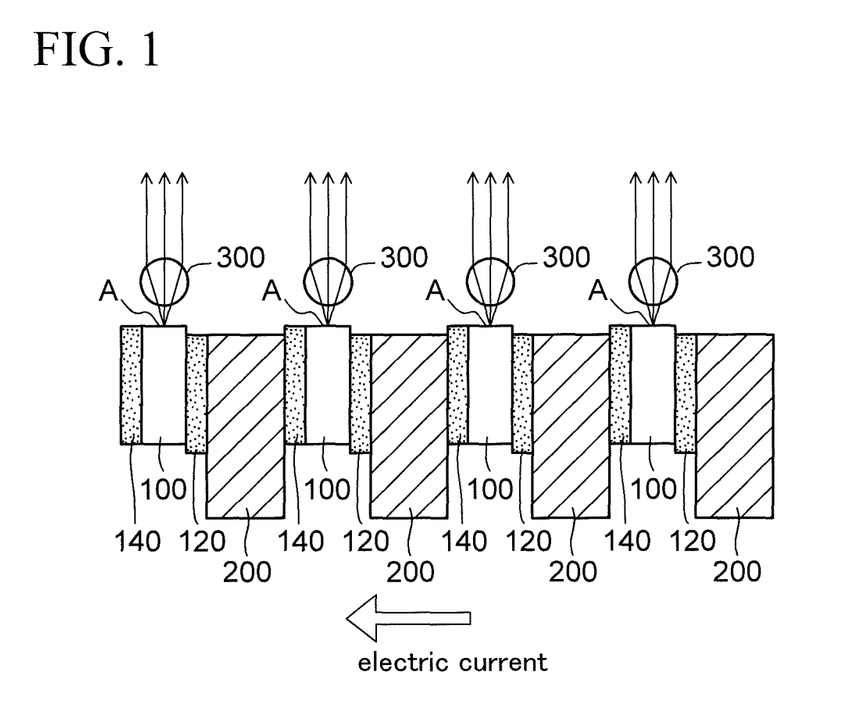
FIG. 1 is a sectional view depicting a semiconductor laser device in the related art.

As depicted in FIG. 1, in a semiconductor laser device in the related art, a semiconductor laser element 100 is arranged between copper (Cu) tungsten (W) members 200 respectively, and the semiconductor laser elements 100 are stacked in the horizontal direction via the copper tungsten member 200. Each semiconductor laser element 100 has a light emitting surface A on its upper end part.

The each semiconductor laser element 100 is arranged in such a manner that one side surface of each element 100 is joined to the copper tungsten member 200 via a gold (Au) tin (Sn) solder layer 120 in a state that the light emitting surface A is directed upward respectively. Also, the other side surface of each element 100 is joined to the copper tungsten member 200 via an indium (In) solder layer 140 respectively.

Also, a cylindrical lens 300 is arranged independently over the semiconductor laser elements 100 respectively. The copper tungsten members 200 that stack a plurality of semiconductor laser elements 100 are mounted on a metal radiation plate (heat block) via an insulating substrate such as an AlN substrate, a BeO substrate, or the like.

The each semiconductor laser element 100 is connected electrically in series via the copper tungsten member 200, and an electric current is supplied from the semiconductor laser element 100 located to the right side to the semiconductor laser element 100 located to the left side.

Accordingly, a light is emitted upward from the light emitting surfaces A of the each semiconductor laser element 100 respectively, and the emitted lights are converged by the cylindrical lens 300 respectively and then are emitted as a high-power laser to the outside.

In this manner, in the semiconductor laser device in the related art, the copper tungsten members 200 are used as intermediate members for stacking a plurality of semiconductor laser elements 100. Since the copper tungsten members 200 have an insufficient processing precision, neither an enough thickness precision can be obtained nor an enough surface precision (smoothness) can be obtained.

Therefore, particularly in the case that a thickness of the copper tungsten member 200 is set in a range from 400 to 100 μm and an arrangement pitch of the semiconductor laser elements 100 is narrowed, in many cases a variation in the arrangement pitch of the semiconductor laser elements 100 exceeds a tolerance.

As a result, when the cylindrical lenses 300 are arranged with a designed arrangement pitch of the semiconductor laser elements 100, a misalignment is caused between the semiconductor laser element 100 and the cylindrical lens 300, and thus it becomes difficult to construct the stacked type semiconductor laser device with high precision.

Also, the copper tungsten members 200 are made of conductive material. Therefore, it is necessary that such copper tungsten members 200 are mounted on the metal radiation plate via the insulating substrate, and such a problem exists that a component count is increased.

In this way, in the case that the copper tungsten members 200 are used, in order to arrange the semiconductor laser elements 100 at a narrow pitch with good precision, any improvement in the thickness precision of the copper tungsten member 200, and any devising in the alignment of the cylindrical lenses 300, and the like are needed. As a result, it is feared that an increase in cost is brought about.

An embodiment explained hereunder can solve the disadvantages mentioned above.

Embodiment

Figure 2A:
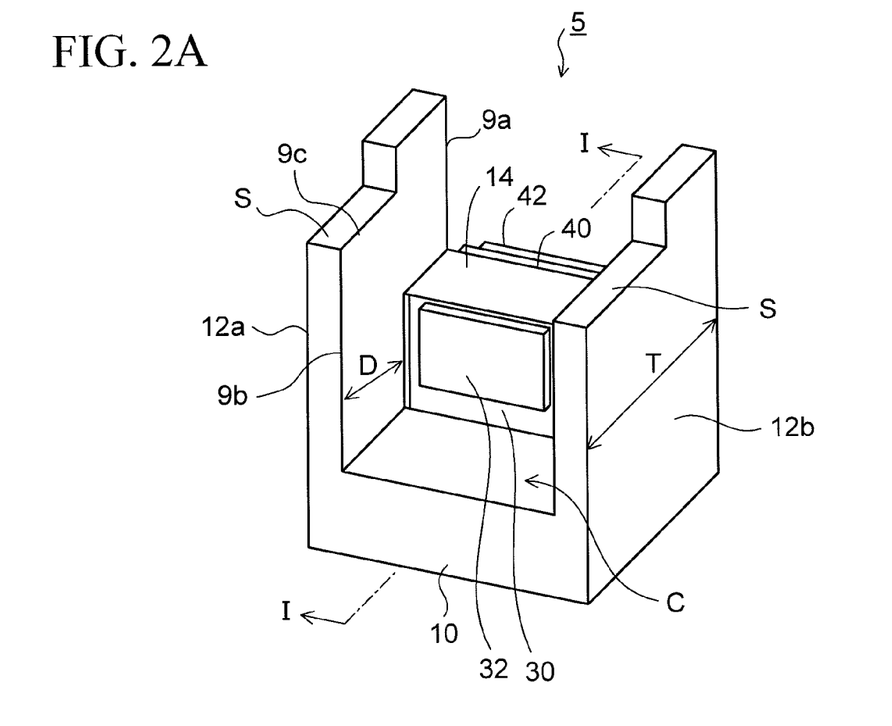
FIG. 2A is a perspective view depicting a package component according to an embodiment.
Figure 2B:
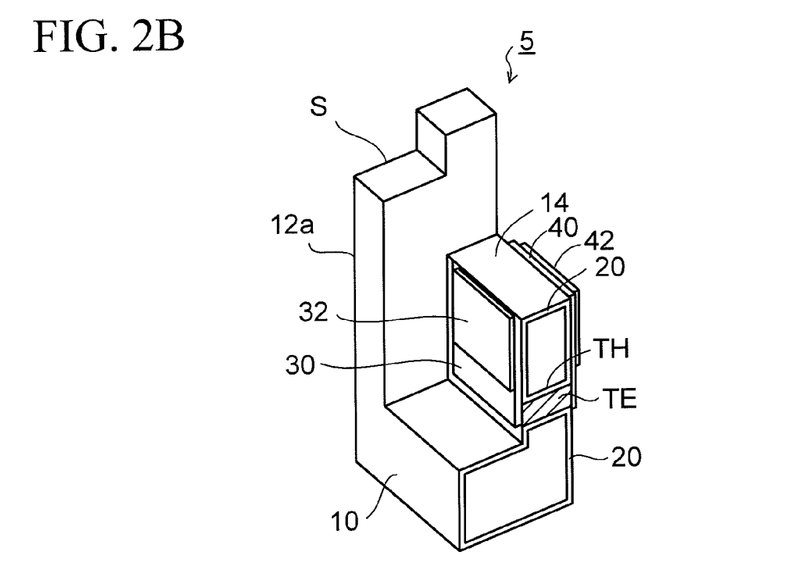
FIG. 2B is a fragmental perspective view depicting a sectional structure taken along I-I in FIG. 2A.

FIG. 2A is a perspective view depicting a package component for mounting a light emitting element, according to an embodiment, and FIG. 2B is a fragmental perspective view depicting a sectional structure taken along I-I in the perspective view of FIG. 2A.

As depicted in FIG. 2A, a package component of the embodiment is formed of a silicon cubic member, which is shaped into an individual piece by processing three-dimensionally a silicon wafer. The package component 5 has a bottom portion 10, a first sidewall portion 12a and a second sidewall portion 12b provided to both ends of the bottom portion 10 respectively to stand upright, and a backwall portion 14 provided to the inner part side of the bottom portion 10 to stand upright and connected to the first and second sidewall portions 12a, 12b. A height of the backwall portion 14 is set lower than heights of the first and second sidewall portions 12a, 12b, and an area located over the backwall portion 14 constitutes an opening portion 9a.

Also, a front wall portion opposing to the backwall portion 14 does not exist, and a front part of the area where the first sidewall portion 12a and the second sidewall portion 12b are opposed to each other, constitutes an opening portion 9b. Also, a ceiling portion opposing to the bottom portion 10 does not exist, and the ceiling portion constitutes an opening portion 9c. Accordingly, a cavity C (cubic space) that is dug in the silicon substrate is provided to the inner side of the first sidewall portion 12a, the second sidewall portion 12b, and the backwall portion 14.

In this manner, the package component 5 is formed of the silicon solid member that is constructed by the bottom portion 10, the first and second sidewall portions 12a, 12b, and the backwall portion 14, and its surfaces (all exposed surfaces) are covered with an insulating layer 20 such as a silicon oxide layer, or the like (perspective view in FIG. 2B). After the silicon cubic member having a desired shape is manufactured, the insulating layer 20 can be formed on the surface of the silicon cubic member by thermally oxidizing the silicon cubic member.

Also, the front parts (parts corresponding to the cavity C) of upper surfaces of the first and second sidewall portions 12a, 12b are cut downward partially, thus the level difference portion S used for positioning the lens are formed respectively. The level differences like a stair are illustrated as the level difference portion S. But, as the level difference portion S used for positioning the lens, concave portions (U-shaped cutting portion, V-shaped cutting portion, or the like) may be formed in the position where the lens is arranged.

By further reference to the perspective view of FIG. 2B, a through hole TH which penetrates from the inner surface to the outer surface is provided in the backwall portion 14. A penetration electrode TE made of copper (Cu), or the like is filled in the through hole TH via the insulating layer 20. The penetration electrode TE is insulated electrically from the backwall portion 14 (silicon) by the insulating layer 20.

A first wiring layer 30 is formed on the whole of the inner side surface of the backwall portion 14, and a second wiring layer 40 is formed on the whole of the outer side surface of the backwall portion 14. The first wiring layer 30 and the second wiring layer 40 are connected mutually via the penetration electrode TE.

Furthermore, an indium (In) layer 32 (first conductive joining material) is formed in an upper part side of the first wiring layer 30 on the inner side surface of the backwall portion 14. Also, a gold (Au) tin (Sn) alloy layer 42 (second conductive joining material) is formed in an upper part side of the second wiring layer 40 on the outer side surface of the backwall portion 14.

In this case, at least surfaces of the first and second wiring layers 30, 40 may be formed of a gold (Au) layer respectively, and also the first and second wiring layers 30, 40 may be formed of a stacked metal film in which a copper layer, or the like is formed under the gold layer respectively.

In this manner, the gold tin alloy layer 42 formed on the outer side surface of the backwall portion 14 is connected electrically to the indium layer 32 formed on the inner side surface of the backwall portion 14, via the second wiring layer 40, the penetration electrode TE, and the first wiring layer 30.

Then, as described later, a side surface of a light emitting element (a semiconductor laser element, or the like) is joined to the indium layer formed on the inner side surface of the backwall portion 14, and is mounted thereon.

Here, in the present embodiment, the indium layer 32 is illustrated as the first conductive joining material that is used for mounting the light emitting element on the package component 5. Besides it, various solder layers, a conductive paste such as a silver paste, or the like may be used as the first conductive joining material.

Also, the gold tin alloy layer 42 is illustrated as the second conductive joining material which is formed on the outer side surface of the backwall portion 14 of the package component 5. Similarly, various solder layers, the conductive paste such as the silver paste, or the like may be used.

A depth D of the cavity C of the package component 5 in FIG. 2A is set to the depth that enables the light emitting element to be stacked on other package component 5 without clearance, at the time when the package components 5 on which the light emitting element is mounted, are to be stacked in the horizontal direction (depth direction).

That is, the depth D of the cavity C of the package component 5 is set so as to correspond roughly to a total thickness of the first wiring layer 30 and the indium layer 32, the light emitting element, and the second wiring layer 40 and the gold tin alloy layer 42.

Also, preferably a thickness T of the package component 5 should be set in a range from 400 to 100 µm. And when the package components 5 on which the light emitting element is mounted are to be stacked in the horizontal direction, an arrangement pitch of the light emitting elements is roughly decided by the thickness T of the package component 5.

The package components 5 of the present embodiment can be manufactured with good precision by finely processing the silicon wafer, based on the photolithography and the wet etching or the dry etching. Therefore, a thickness precision and a surface precision can be improved remarkably rather than the case where the copper tungsten member is employed.

Accordingly, a variation of thickness T (FIG. 2A) can be suppressed within the design specifications among a plurality of package components 5.

As a result, By stacking the light emitting elements via the package component 5 of the present embodiment, a plurality of light emitting elements can be arranged at a narrow pitch with good precision.

Next, a method of manufacturing an light emitting device by stacking the light emitting elements in the horizontal direction while using the above-mentioned package component 5 will be explained hereunder.

Figure 3:
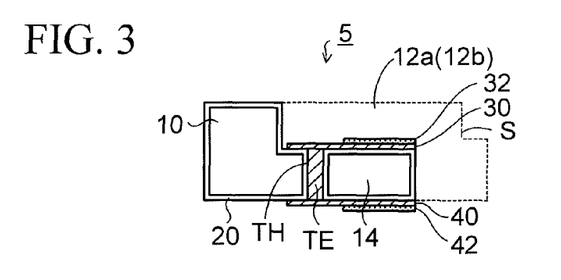
FIG. 3 is a sectional view (#1) depicting a method of manufacturing a light emitting device according to the embodiment.

As depicted in FIG. 3, the package component 5 in FIG. 2A described above is prepared. In FIG. 3, a state in which the package component 5 in FIG. 2A is turned over in the lateral direction and is arranged, is depicted schematically.

Figure 4:
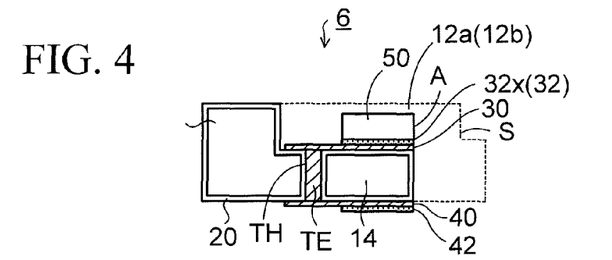
FIG. 4 is a sectional view (#2) depicting the method of manufacturing the light emitting device according to the embodiment.

Then, as depicted in FIG. 4, a light emitting element 50 like a chip is prepared. The light emitting element 50 is an end surface emitting type optical device including a light emitting surface A on one end part, and a light is emitted outward from the light emitting surface A. As the light emitting element 50, for example, a semiconductor laser element having a double heterojunction structure in GaAs/AlGaAs series is used. An electrode (not shown) is provided on both side surfaces of the light emitting element 50 respectively.

Then, the electrode on one side surface of the light emitting element 50 is arranged on the indium layer 32 of the package component 5 such that the light emitting surface A of the light emitting element 50 is directed outward. Then, while pushing the light emitting element 50 toward the indium layer 32 side, the heating is applied to the light emitting element 50 in a temperature atmosphere at about 200° C., and thus the light emitting element 50 is joined to the indium layer 32.

At this time, the indium layer 32 is alloyed with the underlying first wiring layer 30 (gold layer), and they become an indium gold alloy layer 32x. A melting temperature of the indium layer 32 is relatively low like 180 to 200° C., but a melting temperature of the resultant indium gold alloy layer 32x is increased to about 500° C.

Accordingly, a light emitting element mounting component 6 is obtained by mounting the light emitting element 50 on one package component 5. Then, such light emitting element mounting component 6 is prepared in predetermined numbers.

As described above, the light emitting element 50 may be mounted on the package component 5 by the solder layer or the conductive paste other than the indium layer 32.

Figure 5:
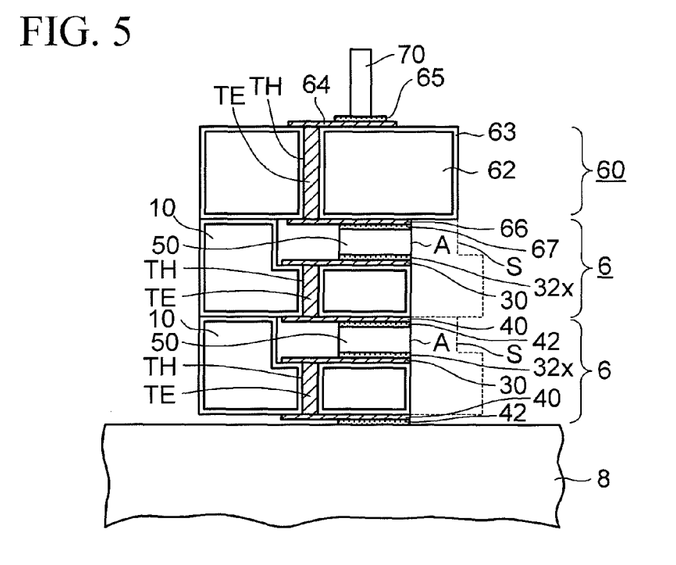
FIG. 5 is a sectional view (#3) depicting the method of manufacturing the light emitting device according to the embodiment.

Then, as depicted in FIG. 5, a plurality of light emitting element mounting components 6 are stacked on a processing stage 8 such that the gold tin alloy layer 42 of the light emitting element mounting component 6 located to the upper side is arranged on the electrode on the other side surface of the light emitting element 50 of the light emitting element mounting component 6 located to the lower side. Respective light emitting element mounting components 6 are stacked so as to direct toward the identical direction.

Then, a wiring component 60 is stacked on the light emitting element mounting component 6 located to the uppermost part. In the wiring component 60, the through hole TH is provided in a silicon substrate 62, and an insulating layer 63 is provided on both surfaces of the silicon substrate 62 and the inner surface of the through hole TH. Then, the penetration electrode TE made of copper, or the like is filled in the through hole TH.

Then, a first wiring layer 64 connected to the penetration electrode TE is formed on the upper surface side of the silicon substrate 62. A first connection pin 70 is joined to an indium layer 65 which is formed on the first wiring layer 64 on the upper surface side.

Also, a second wiring layer 66 connected to the penetration electrode TE is formed on the lower surface side of the silicon substrate 62. A gold tin alloy layer 67 is formed on the second wiring layer 66 on the lower surface side.

Then, the wiring component 60 is stacked on the light emitting element mounting component 6 located to the uppermost part such that the gold tin alloy layer 67 formed on the lower surface side of the wiring component 60 corresponds to the electrode on the side surface of the light emitting element 50 of the light emitting element mounting component 6 located to the uppermost part.

In this state, a stacked structural body in FIG. 5 is heated in a temperature atmosphere of about 300° C., while pressing downward by the pressing machine. Accordingly, the light emitting element 50 of the light emitting element mounting component 6 located to the lower side and the gold tin alloy layer 42 of the light emitting element mounting component 6 located to the upper side are joined together. At the same time, the light emitting element 50 of the light emitting element mounting component 6 located to the uppermost part and the gold tin alloy layer 67 of the wiring component 60 are also joined together.

At this time, the bottom portion 10 and the first and second sidewall portions 12a, 12b of the package component 5 of the light emitting element mounting component 6 are put into a simple contact state to other package component 5.

At this time, as described above, the depth D of the cavity C (FIG. 2A) of the package component 5 is also set such that the light emitting elements 50 are arranged in the depth D direction of the cavity C without clearance. Therefore, a plurality of light emitting element mounting components 6 and the wiring component 60 are stacked toward the horizontal direction without inclination.

An arrangement pitch of the stacked light emitting elements 50 is roughly decided by the thickness T (FIG. 2A) of the package component 5. As described above, since the package component 5 is formed by finely processing the silicon wafer with high precision, a plurality of light emitting elements 50 can be arranged at a narrow pitch with high precision.

Also at this time, as described above, the indium layer 32 of each light emitting element mounting component 6 is also changed into the indium gold alloy layer 32x having a high melting temperature (about 500° C.) at the time when the light emitting element 50 is mounted. Therefore, neither the indium gold alloy layer 32x is melted again by the heating process (about 300° C.), nor it is possible that a failure of the junction is caused.

As described above, the light emitting element 50 of one light emitting element mounting component 6 may be joined to the other light emitting element mounting component 6 by the solder layer or the conductive paste other than the gold tin alloy layers 42, 67.

Figure 6:
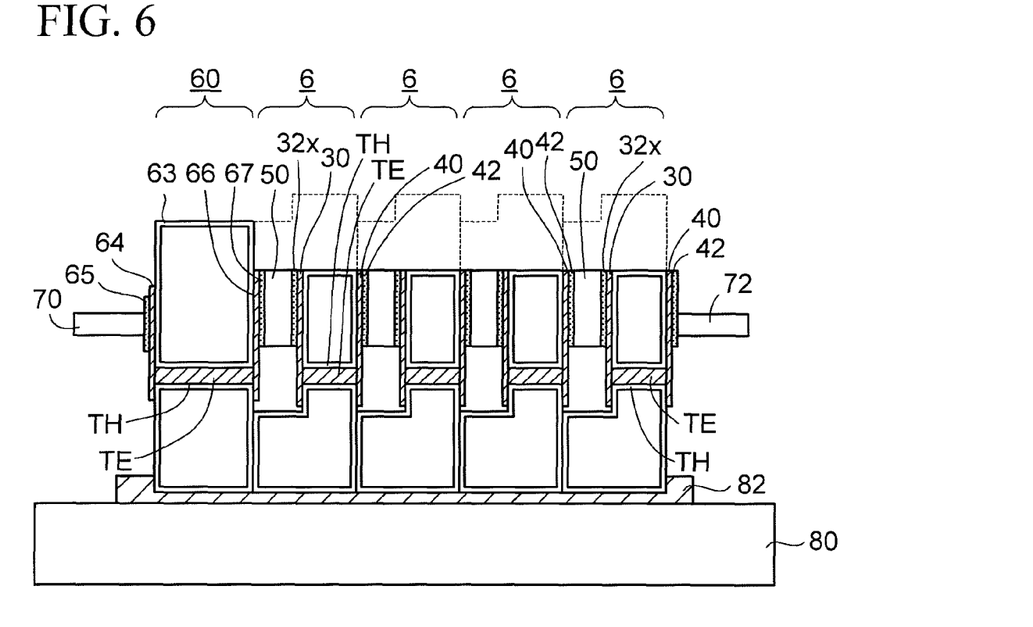
FIG. 6 is a sectional view (#4) depicting the method of manufacturing the light emitting device according to the embodiment.

In FIG. 6, such a state is depicted that four light emitting element mounting components 6 are stacked by the above method and also it is arranged such that the stacking direction is set in the horizontal direction. As depicted in FIG. 6, after the light emitting element mounting components are stacked by the method in FIG. 5, a second connection pin 72 is joined to the gold tin alloy layer 42 of the light emitting element mounting component 6 on the end side opposite to the wiring component 60 (the lowermost side at the time of stacking in FIG. 5).

Then, an indium layer 82 is formed on a radiation plate 80 (heat block) made of metal such as copper, or the like, and the stacked body of the light emitting element mounting components 6 is pushed toward the indium layer 82 and is arranged thereon.

The package component 5 of the present embodiment is formed of the silicon cubic member which is covered with the insulating layer 20. Therefore, the stacked body of the light emitting element mounting components 6 can be mounted on the radiation plate 80 without intervention of the insulating substrate.

Figure 7:
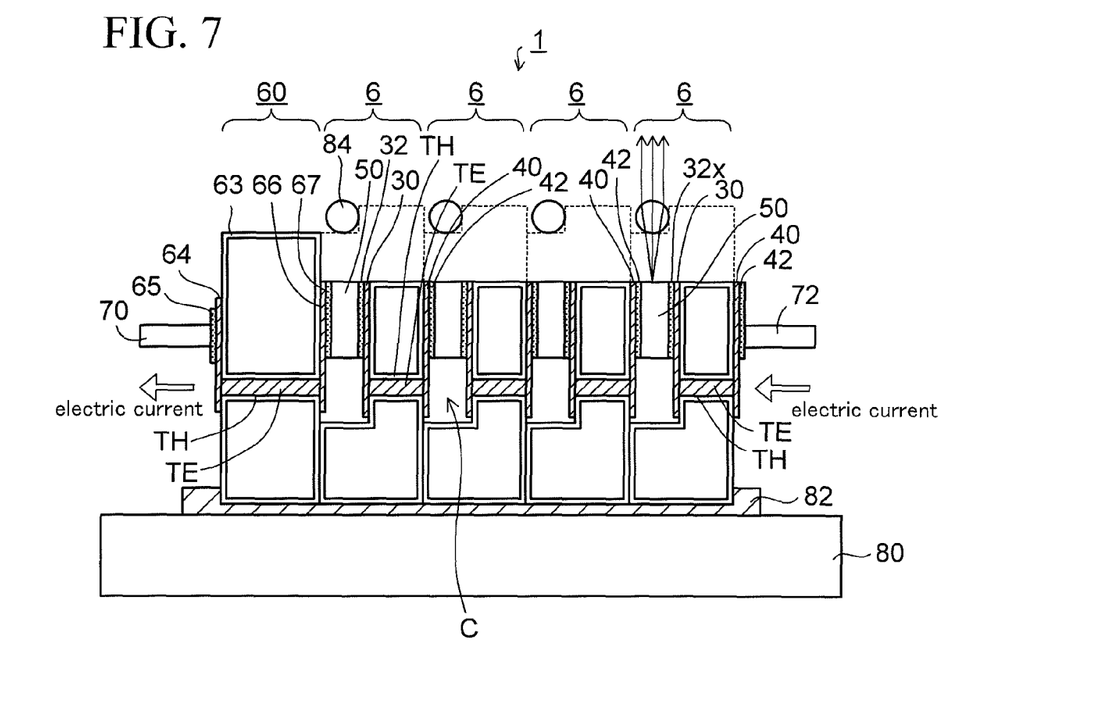
FIG. 7 is a sectional view depicting a light emitting device according to an embodiment.

Then, as depicted in FIG. 7, an epoxy resin is coated on the level difference portions S used for positioning the lenses in respective light emitting element mounting components 6, then the cylindrical lens 84 is pushed toward the vertical surfaces of the level difference portions S and is arranged thereon respectively, and then the epoxy resin is cured by the heating process to fix the cylindrical lenses 84. At this time, the level difference portion S can be formed in the positions corresponding to the light emitting surfaces A of the light emitting elements 50 with good precision respectively. Therefore, the cylindrical lenses 84 are aligned with the light emitting elements 50 with good precision and are arranged thereon.

As a result, without employment of the complicated alignment mechanism, the cylindrical lenses 84 can be aligned with the light emitting elements 50 by the very simple method and can be mounted thereon. Here, in the case that the concave portion is formed as the level difference portion S, the cylindrical lenses 84 are arranged in the concave portions respectively, thereby the cylindrical lenses 84 can be aligned with the light emitting elements 50 and can be mounted thereon.

By the above contents, a light emitting device 1 of the embodiment is obtained.

Figure 8:
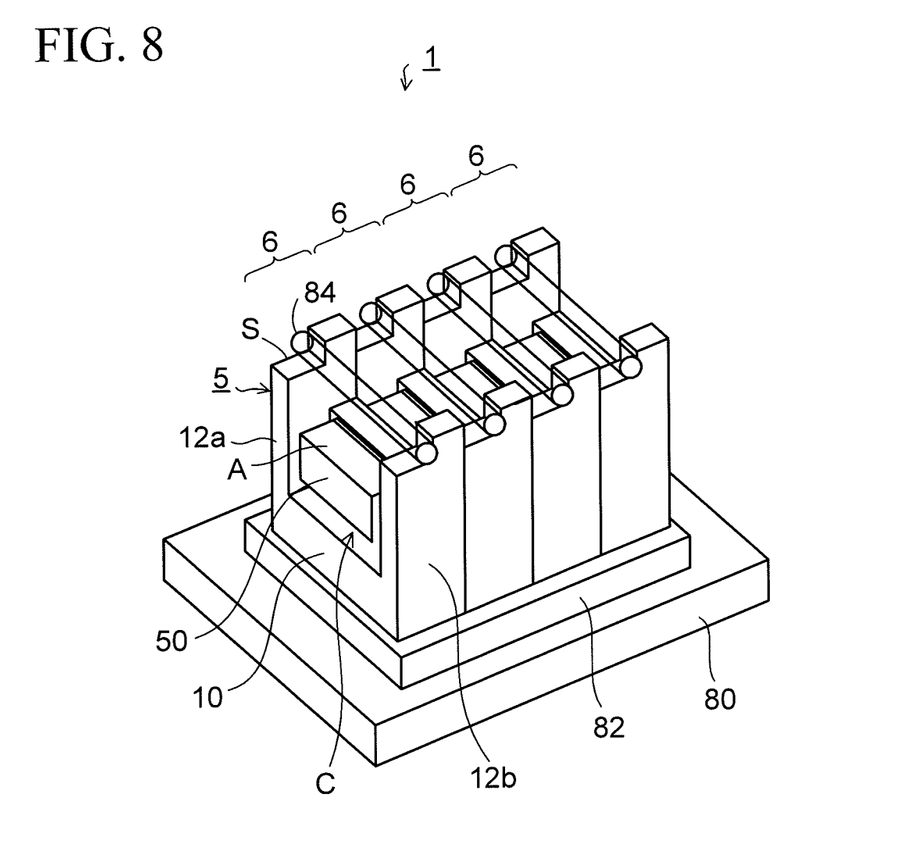
FIG. 8 is a perspective view depicting the light emitting device according to the embodiment.

In FIG. 8, a perspective view of the structural body, in which the wiring component 60 and the second connection pin 72 are omitted from the light emitting device 1 in FIG. 7 to facilitate the explanation, is depicted.

As depicted in FIG. 7 and FIG. 8, in the light emitting device 1 of the present embodiment, a plurality of light emitting element mounting components 6 having the above-mentioned structure are stacked in the depth direction (horizontal direction) of the cavity C of the package component 5. In the example in FIG. 7 and FIG. 8, four light emitting element mounting components 6 are stacked in the horizontal direction. In this case, the stacked number of the light emitting element mounting components 6 in the horizontal direction can be set arbitrarily.

Also, the wiring component 60 having the above structure is connected electrically to the light emitting element 50 of the light emitting element mounting component 6 located to the endmost part and is stacked thereon (FIG. 7).

Also, the cylindrical lens 84 is arranged on the level difference portions S used for positioning the lenses in the light emitting element mounting components 6 respectively. The cylindrical lens 84 is pushed toward the level difference portion S, thereby the cylindrical lens 84 is aligned with the light emitting surface A of the light emitting element 50 and is arranged thereon.

Then, the light emitting device 1 is mounted on the radiation plate 80 made of metal via the indium layer 82 via the indium layer 82.

In the light emitting device 1 of the present embodiment, as depicted in FIG. 7, a plurality of light emitting elements 50 which are arranged side by side in the horizontal direction are connected electrically in series. An electric current which is supplied from the second connection pin 72 located to the right side is supplied to the light emitting element 50 via the gold tin alloy layer 42, the second wiring layer 40, the penetration electrode TE, the first wiring layer 30, and the indium gold alloy layer 32x. Also, the electric current is supplied sequentially to the subsequent light emitting elements 50 via the similar current path, and finally the electric current flows to the first connection pin 70 side of the wiring component 60.

Accordingly, a light is emitted from the light emitting surfaces A of the light emitting elements 50 respectively, and the emitted lights are converged by the cylindrical lens 84 respectively and are emitted to the outside as the high-power laser. A heat generated from the light emitting elements 50 is radiated to the radiation plate 80 via the underlying indium layer 82.

In the present embodiment, since the insulating substrate does not exist in the radiation path, the good radiating characteristic can be obtained. Accordingly, reliability of the light emitting device 1 can be improved, and the light emitting device 1 is advantageous from such a viewpoint that a component count can be reduced.

Here, in the present embodiment, based on that the penetration electrode TE is provided in the backwall portions 14 of the package components 5 respectively, the adjacent light emitting elements 50 are connected electrically in series and the electric current is supplied through there. But there is no necessity that the penetration electrode TE should always be provided to the package component 5.

In case that the penetration electrode TE is not provided to the package component 5, a lead terminal, or the like connected to the light emitting elements 50 is fitted to the package components 5 respectively, and the electric current is supplied individually.

In the light emitting device 1 of the present embodiment, a plurality of light emitting elements 50 are stacked in the horizontal direction via the package component 5 which is formed of the silicon cubic member. Since the silicon cubic member is manufactured with high precision by the fine processing, a sufficient thickness precision and a sufficient surface precision can be obtained. Therefore, the light emitting elements 50 can be stacked at a narrow pitch with good precision, and thus the stacked type light emitting device which is made small size can be constructed with good precision.

Further, the level difference portion S used for positioning the lens can be provided in the package component 5 so as to align with the position of the light emitting surface A of the light emitting element 50 which is to be mounted. Accordingly, without employment of the complicated aligning mechanism, the cylindrical lens 84 can be arranged while easily aligning with the light emitting element 50, and thus a reduction in cost can be achieved.

Figure 9:
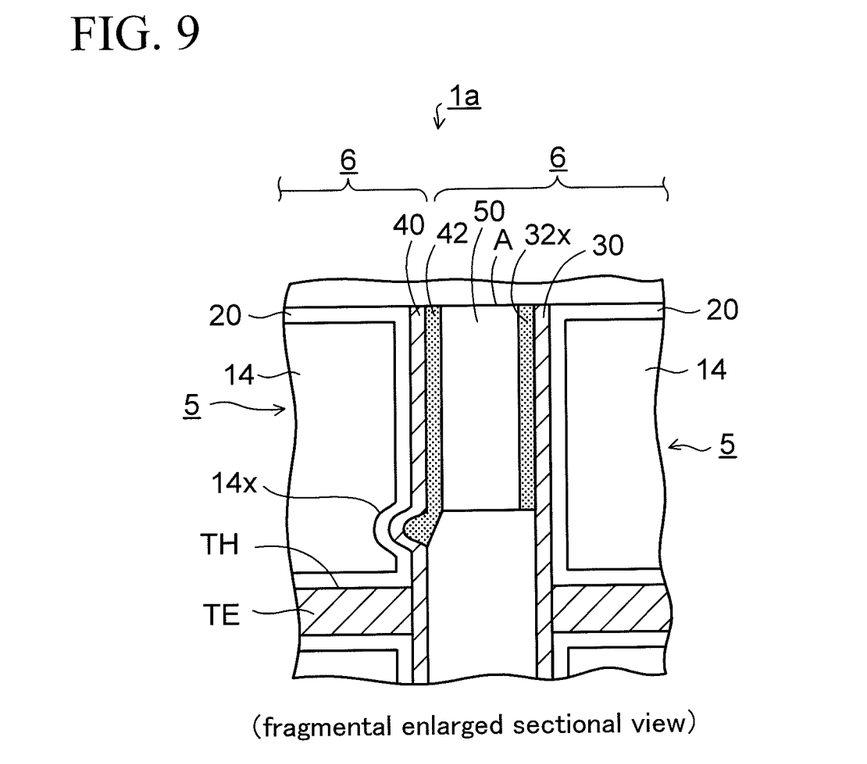
FIG. 9 is a fragmental sectional view depicting a light emitting device according to a first variation of the embodiment.

FIG. 9 is a fragmental enlarged sectional view of a light emitting device 1a according to a first variation of the embodiment. As depicted in FIG. 9, in the light emitting device 1a of the first variation, in the outer side surface of the backwall portion 14 of the package component 5, a concave portion 14x used to pour the melted gold tin alloy layer 42 is provided in the lower side of the gold tin alloy layer 42.

In FIG. 9, a state obtained after a plurality of light emitting element mounting components 6 are stacked in the horizontal direction, is depicted. The gold tin alloy layer 42 which is melted at the time of joining step flows into the concave portion 14x of the backwall portion 14, and is collected there.

Accordingly, the excessive gold tin alloy layer 42 flows into the concave portion 14x and is collected there. As a result, a variation in the thickness of the gold tin alloy layer 42 for joining the light emitting element 50 can be suppressed, and a precision of the arrangement pitch of the light emitting elements 50 can be improved further more.

Figure 10:
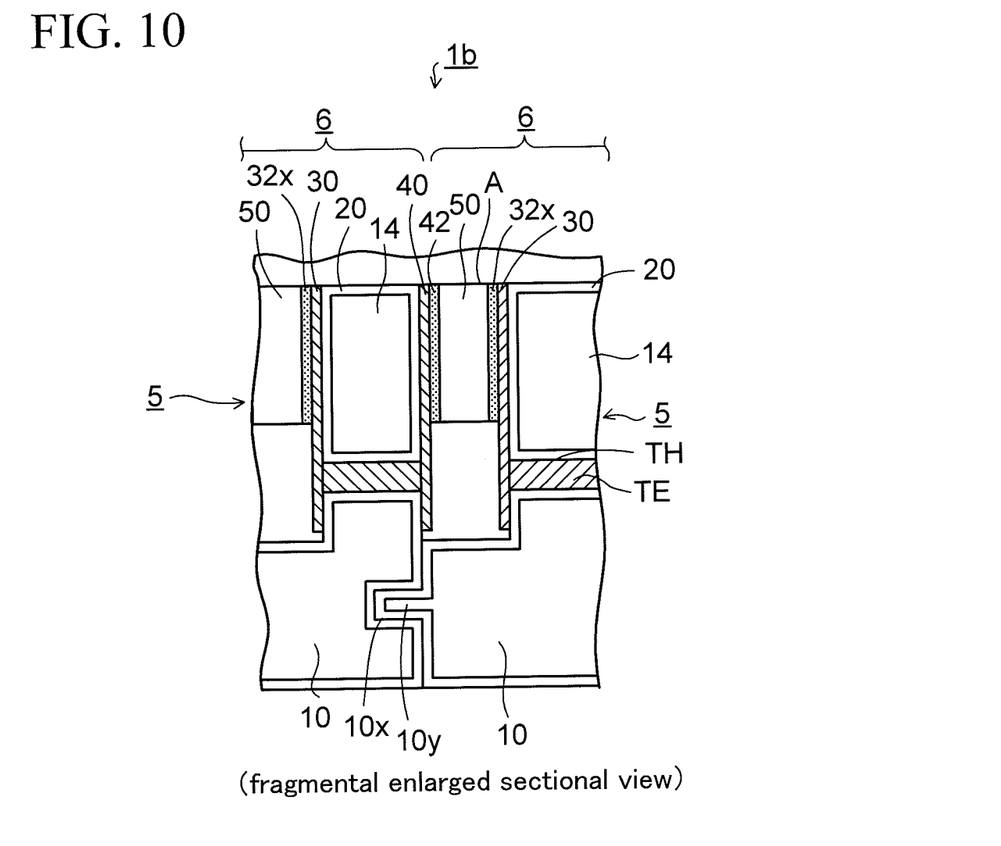
FIG. 10 is a fragmental sectional view depicting a light emitting device according to a second variation of the embodiment.

Also, FIG. 10 is a fragmental enlarged sectional view of a light emitting device 1b according to a second variation of the embodiment. As depicted in FIG. 10, in the light emitting device 1b of the second variation, a concave portion 10x used for the fitting is provided in the outer side surface at the rear of the bottom portion 10 of one package component 5. Then, a convex portion 10y used for the fitting is provided on the outer side surface at the front of the bottom portion 10 of the other package component 5 so as to protrude along the horizontal direction.

When a plurality of light emitting element mounting components 6 are stacked in the horizontal direction, the convex portion 10y of the bottom portion 10 of the other package component 5 is fitted into the concave portion 10x of the bottom portion 10 of one package component 5. Accordingly, when the light emitting element mounting components are arranged in the horizontal direction, a misalignment in the vertical direction between a plurality of light emitting element mounting components 6 can be prevented, and reliability of the light emitting device can be improved further more.

All examples and conditional language recited herein are intended for pedagogical purpose to aid the reader in understanding the invention and the concepts contributed by the inventor to furthering the art, and are to be construed as being without limitation to such specifically recited examples and conditions, nor does the organization of such examples in the specification relates to a showing of the superiority and inferiority of the invention. Although the embodiments of the present invention have been described in detail, it should be understood that the various changes, substitutions, and alterations could be made hereto without departing from the spirit and scope of the invention.

What is claimed is:

1. A light emitting device, comprising:
a light emitting element mounting component including:
    a cubic package component formed of a silicon member covered with an insulating layer, and the cubic package component including a bottom portion, a sidewall portion provided to stand upright on both ends of the bottom portion respectively, and a backwall portion provided to stand upright on an innermost part of the bottom portion, and the cubic package component in which a cavity is provided in an inner side,
wherein the cubic package component including a penetration electrode formed via the insulating layer in a thickness direction of the backwall portion, and wiring ers provided on the inner side surface and an outer side surface of the backwall portion, respectively, and connected mutually via the penetration electrode; and
a light emitting element mounted on an inner side surface of the backwall portion of the cubic package component, and including a light emitting surface on an upper end part,
wherein a plurality of said light emitting element mounting components are stacked in a depth direction of the cavity to direct toward an identical direction, and
wherein one side surface of the light emitting element is connected to the wiring layer on the inner side surface of the backwall portion via a first conductive joining material, and another side surface of the light emitting element is connected to the wiring layer on the outer side surface of the backwall portion of the other package component via a second conductive joining material.

2. The light emitting device according to claim 1, wherein a level difference portion is provided in upper surfaces of respective sidewall portions of the package components respectively, and
further comprising:
    a cylindrical lens arranged to the level difference portion, and aligned with the level difference portion, respectively, and converging a light which is emitted from the light emitting element.

3. The light emitting device according to claim 1, wherein the first conductive joining material is an indium gold alloy layer, and the second conductive joining material is a gold tin alloy layer.

4. The light emitting device according to claim 1, wherein a wiring component is connected to a side surface of the light emitting element of the light emitting element mounting component located to an endmost part, and is stacked thereon.

5. The light emitting device according to claim 1, wherein a stacked body of the light emitting element mounting components is mounted on a radiation plate via an indium layer.

6. A package component, comprising:
a bottom portion;
a sidewall portion provided to stand upright on both ends of the bottom portion respectively;
a backwall portion provided to stand upright on an innermost part of the bottom portion;
a penetration electrode formed via the insulating layer in a thickness direction of the backwall portion;
wiring layers provided on the inner side surface and the outer side surface of the backwall portion, respectively, and connected mutually via the penetration electrode;
a first conductive joining material provided on the wiring layer on an inner side surface of the backwall portion and used for joining a light emitting element; and
a second conductive joining material provided on the wiring layer on an outer side surface of the backwall portion,
wherein the package component has a cubic shape, and is formed of a silicon member covered with an insulating layer, and a cavity is provided in an inner side of the package component.

7. The package component according to claim 6, wherein a level difference portion for arranging to align a cylindrical lens which converges a light emitted from the light emitting element, is provided in upper surfaces of the sidewall portions respectively.

8. The package component according to claim 6, wherein at least a surface of the wiring layer on the inner side surface of the backwall portion is formed of a gold layer, and the first conductive joining material is formed of an indium layer, and the second conductive joining material is formed of a gold tin alloy layer.

* * * * *